(12) United States Patent
Fratti et al.

(10) Patent No.: US 7,710,170 B2
(45) Date of Patent: May 4, 2010

(54) INTERNAL SUPPLY VOLTAGE CONTROLLED PLL AND METHODS FOR USING SUCH

(75) Inventors: Roger A. Fratti, Mohnton, PA (US); William B. Wilson, Macungie, PA (US); Kenneth W. Paist, Spring City, PA (US)

(73) Assignee: Agere Systems Inc., Allentown, PA (US)

( * ) Notice: Subject to any disclaimer, the term of this patent is extended or adjusted under 35 U.S.C. 154(b) by 79 days.

(21) Appl. No.: 11/928,366

(22) Filed: Oct. 30, 2007

(65) Prior Publication Data

US 2009/0108890 A1    Apr. 30, 2009

(51) Int. Cl.
*H03L 7/06* (2006.01)
(52) U.S. Cl. .................................. 327/156; 327/147
(58) Field of Classification Search .................. None
See application file for complete search history.

(56) References Cited

U.S. PATENT DOCUMENTS

| | | | |
|---|---|---|---|
| 4,731,585 A | 3/1988 | Fox | |
| 5,719,573 A | 2/1998 | Leung et al. | |
| 6,011,432 A | 1/2000 | Fratti et al. | |
| 6,191,963 B1 | 2/2001 | McPartland et al. | |
| 6,407,600 B1 * | 6/2002 | Lu et al. | 327/156 |
| 7,129,759 B2 * | 10/2006 | Fukami | 327/110 |
| 7,135,934 B2 * | 11/2006 | Sanchez et al. | 331/18 |
| 7,259,600 B1 * | 8/2007 | Song | 327/156 |
| 7,456,661 B2 * | 11/2008 | Schmidt | 327/3 |
| 2002/0017958 A1 * | 2/2002 | Van Zeijl | 331/17 |
| 2005/0068075 A1 * | 3/2005 | Innocent | 327/157 |
| 2005/0127887 A1 * | 6/2005 | Kozaki | 323/283 |

* cited by examiner

*Primary Examiner*—Cassandra Cox
(74) *Attorney, Agent, or Firm*—Hamilton, DeSanctis & Cha

(57) ABSTRACT

Various embodiments of the present invention provide systems and circuits for clock signal generation. For example, various embodiments of the present invention provide semiconductor devices that include a power source and a phase lock loop circuit. The power source provides a supply voltage to the phase lock loop circuit. The phase lock loop circuit includes and on-chip control voltage source and a voltage controlled oscillator. The on-chip control voltage source is capable of producing a control voltage that varies between a minimum voltage and a maximum voltage. The voltage controlled oscillator receives the control voltage and provides a clock signal with a frequency corresponding to the control voltage. The maximum voltage is greater than the supply voltage. For example, in some embodiments of the present invention, the maximum voltage is more than double the supply voltage. As another example, in some embodiments of the present invention, the maximum voltage is more than six times the supply voltage.

17 Claims, 4 Drawing Sheets

INTERNAL SUPPLY VOLTAGE CONTROLLED PLL AND METHODS FOR USING SUCH

BACKGROUND OF THE INVENTION

The present invention is related to devices and circuits for synthesizing a clock, and more particularly to on-chip approaches for synthesizing a clock signal.

Clock synthesizing is a process whereby a clock signal of a particular frequency and phase is generated based on a frequency reference. Clock synthesizing may be done using a phase lock loop circuit as has become common in many circuit implementations. A typical phase lock loop application utilizes off-chip varactor diode based tuning elements that require large voltage swings to effect a large tuning range. In some implementations, an off-chip power source providing a potential much greater than that provided to the semiconductor device on which the phase lock loop circuit is implemented is used to facilitate the desired large voltage swings.

An example of one such implementation is depicted in FIG. 1 where a semiconductor device 100 includes a phase lock loop circuit 110 providing a clock signal 130. Clock signal 130 may be used to synchronize one or more functions implemented on semiconductor device 100. Semiconductor device 100 is powered by a low voltage power source 120. Phase lock loop circuit 110 includes an off-chip oscillator circuit 140 outlined by dashed lines and powered by a high voltage power source 150. Off-chip oscillator circuit 140 includes a capacitor 142, a capacitor 146, and a resistor 144. In one particular implementation, high voltage power source 150 is approximately thirty volts, while low voltage power source 120 is approximately three volts.

While the circuit of FIG. 1 provides an ability to synthesize a desired clock signal, the circuit requires an off-chip power source in addition to the power source used to drive semiconductor device 100. Such an off-chip high voltage power source is costly both in terms of board area and component cost.

Hence, for at least the aforementioned reasons, there exists a need in the art for approaches for synthesizing a clock signal.

BRIEF SUMMARY OF THE INVENTION

The present invention is related to devices and circuits for synthesizing a clock, and more particularly to on-chip approaches for synthesizing a clock signal.

Various embodiments of the present invention provide semiconductor devices that include a power source and a phase lock loop circuit. The power source provides a supply voltage to the phase lock loop circuit. The phase lock loop circuit includes an on-chip control voltage source and a voltage controlled oscillator. The on-chip control voltage source is capable of producing a control voltage that varies between a minimum voltage and a maximum voltage. The voltage controlled oscillator receives the control voltage and provides a clock signal with a frequency corresponding to the control voltage. The maximum voltage is greater than the supply voltage. For example, in some embodiments of the present invention, the maximum voltage is more than double the supply voltage. As another example, in some embodiments of the present invention, the maximum voltage is more than six times the supply voltage.

In various instances of the aforementioned embodiments, the semiconductor devices further include a frequency reference and a digital phase detector. The digital phase detector compares the frequency reference with a derivative of the clock signal, and provides a digital output indicating a phase difference between the frequency reference and the derivative of the clock signal. In some instances of the aforementioned embodiments, the derivative of the clock signal is a divided version of the clock signal. Further, in some cases, the semiconductor device includes a digital filter that receives the digital output from the digital phase detector, and provides a control output to the on-chip control voltage source. In such cases, the control output corresponds to the phase difference between the frequency reference and the derivative of the clock signal. The control output sets the control voltage between the maximum voltage and the minimum voltage.

In some instances of the aforementioned embodiments, the on-chip control voltage source includes a plurality of capacitively boosted nodes electrically coupled in series, and the control output selects a subset of the capacitively boosted nodes. For example, the on-chip control voltage source may be a charge-pump including a plurality of capacitively boosted nodes electrically coupled in series. In such cases, a number of the capacitively boosted nodes corresponding to the digital output are enabled for operation, and the number of the capacitively boosted nodes enabled for operation corresponds to the control voltage.

Other embodiments of the present invention provide electronic devices that include a power source supplying a supply voltage, and a semiconductor device. The semiconductor device includes: a phase lock loop circuit that receives the supply voltage. The phase lock loop circuit includes an on-chip control voltage source and a voltage controlled oscillator. The on-chip control voltage source is capable of producing a control voltage that varies between a minimum voltage and a maximum voltage. The voltage controlled oscillator receives the control voltage and provides a clock signal with a frequency corresponding to the control voltage. The maximum voltage is greater than the supply voltage. For example, in some embodiments of the present invention, the maximum voltage has a magnitude that is substantially greater than the magnitude of the supply voltage. The electronic devices may be, but are not limited to, a laptop computer, a cellular telephone, a hard disk drive, an audio player, a video player, a navigation device, and a personal digital assistant.

Yet other embodiments of the present invention provide methods for providing a clock signal. The methods include providing a supply voltage, a frequency reference, and a semiconductor device. The semiconductor device includes a phase lock loop circuit that receives the supply voltage and the frequency reference. The phase lock loop circuit includes an on-chip control voltage source, a voltage controlled oscillator, and a digital phase detector. The on-chip control voltage source is capable of producing a control voltage that varies between a minimum voltage and a maximum voltage. The voltage controlled oscillator receives the control voltage and provides a clock signal with a frequency corresponding to the control voltage. The digital phase detector compares the frequency reference with a derivative of the clock signal, and provides a digital output indicating a phase difference between the frequency reference and the derivative of the clock signal. The methods further include generating a control output corresponding to the digital output, and applying the control output to the on-chip control voltage source. Application of the control output sets the control voltage between the maximum voltage and the minimum voltage. In particular instances of the aforementioned embodiments, the methods further include updating the control output based on a change in the clock signal; and applying the updated control output to the on-chip control voltage source to effect a change in the control voltage.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to devices and circuits for synthesizing a clock, and more particularly to on-chip approaches for synthesizing a clock signal.

Figure 1:
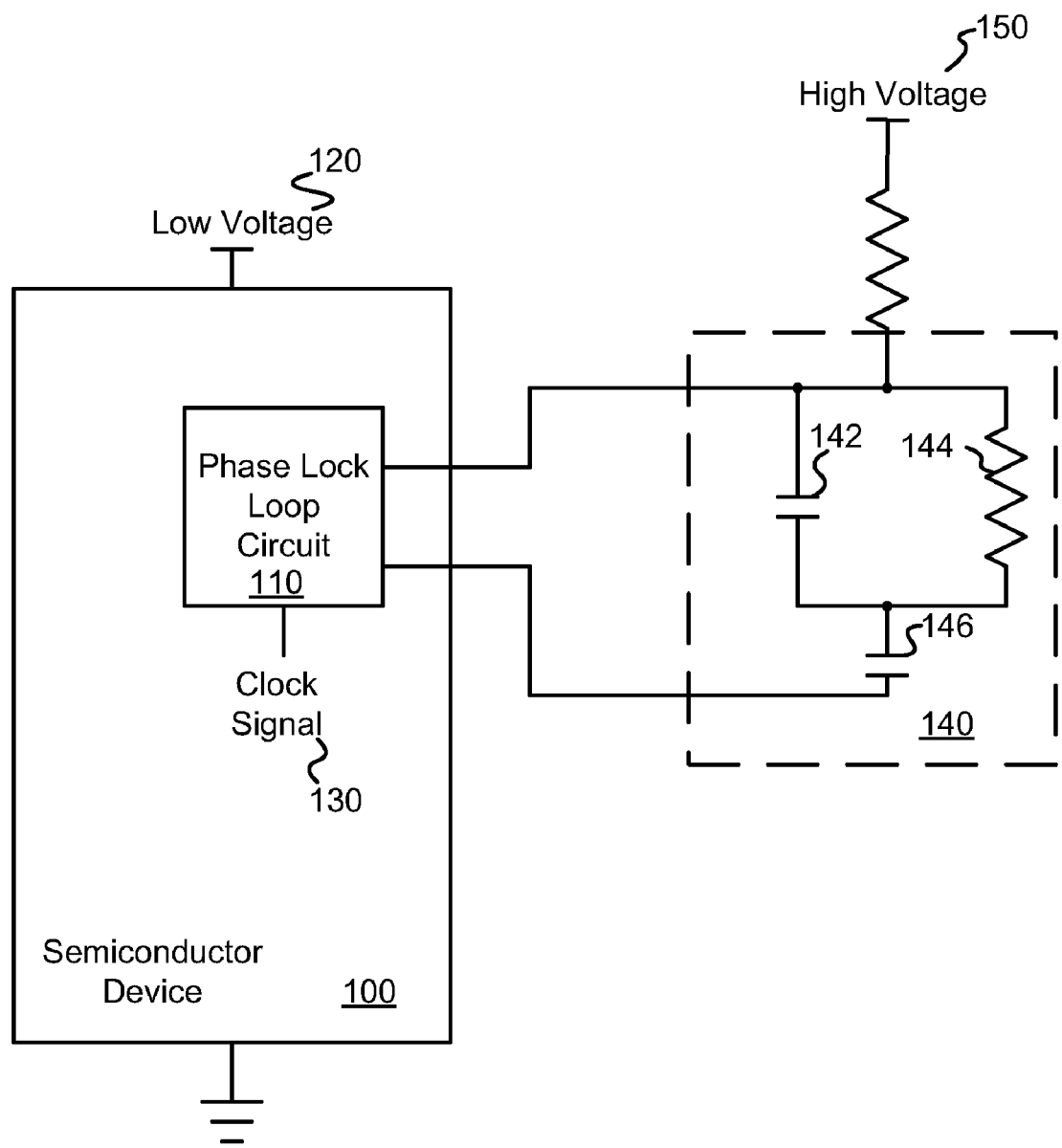
FIG. 1 depicts a prior art approach to clock synthesis.
Figure 2:
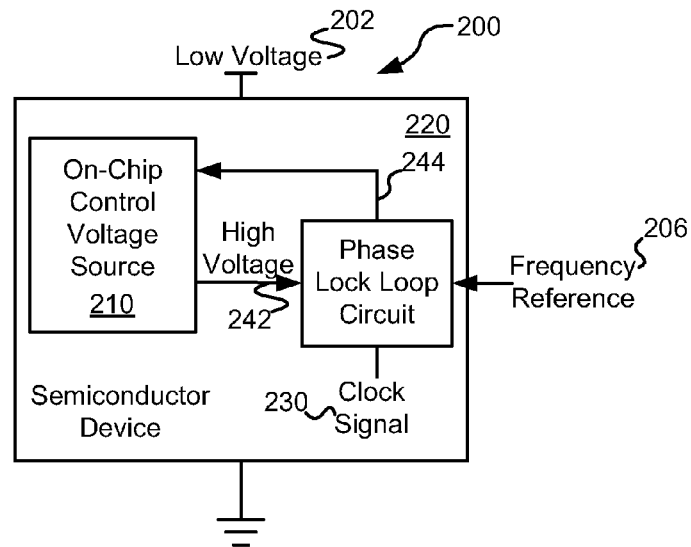
FIG. 2 is a semiconductor device including a phase lock loop circuit utilizing an on-chip control voltage source in accordance with some embodiments of the present invention.

Turning to FIG. 2, a semiconductor device 220 including a phase lock loop circuit 240 capable of synthesizing a clock signal 230 in accordance with one or more embodiments of the present invention is depicted. Semiconductor device 220 is powered using a low voltage source 202 that is made available to various circuits within semiconductor device 220. Phase lock loop circuit 240 provides a feedback signal 244 to an on-chip control voltage source 210, and receives a high voltage input 242 in response. High voltage input 242 may vary between a maximum and a minimum potential available from on-chip control voltage source 210. On-chip control voltage source 210 is capable of providing a maximum voltage that substantially exceeds that of low voltage source 202. For example, in some embodiments of the present invention, on-chip control voltage source 210 provides a maximum voltage potential that is at least five times larger than low voltage source 202. In other embodiments of the present invention, on-chip control voltage source 210 provides a maximum voltage potential that is at least ten times larger than low voltage source 202. In one particular embodiment of the present invention, low voltage source 202 provides a maximum voltage of approximately three volts, and on-chip control voltage source 210 provides a maximum voltage of approximately thirty volts. Based on the disclosure provided herein, one of ordinary skill in the art will appreciate a variety of relationships between the potential provided by on-chip control voltage source 210 and that of low voltage source 202 that provides for the desired tuning range of phase lock loop circuit 240.

In operation, phase lock loop circuit 240 receives a frequency reference signal 206, and compares it with a derivative of clock signal 230. It determines whether the frequency of clock signal 230 needs to be increased or decreased to achieve a defined relationship to frequency reference signal 206. Such a defined relationship may include, but is not limited to, clock signal 230 operating at the same phase and frequency as frequency reference signal 206, clock signal 230 operating at the same phase but a higher frequency than frequency reference signal 206, clock signal 230 operating at the same frequency but with a phase difference from frequency reference signal 206, or clock signal 230 operating at a higher frequency than and with a phase difference from frequency reference signal 206. Based on the disclosure provided herein, one of ordinary skill in the art will recognize a variety of phase and frequency characteristics of clock signal 230 that may be synthesized based on frequency reference 206 in accordance with different embodiments of the present invention.

Where the comparison of frequency reference signal 206 with the derivative of clock signal 230 indicates that clock signal 230 lags the desired clock output (i.e., the frequency of clock signal 230 is too low), feedback signal 244 provides an indication to on-chip control voltage source 210 that modifies high voltage input 242 causing phase lock loop 240 to increase the frequency of clock signal 230. Alternatively, where the comparison of frequency reference signal 206 with the derivative of clock signal 230 indicates that clock signal 230 leads the desired clock output (i.e., the frequency of clock signal 230 is too high), feedback signal 244 provides an indication to on-chip control voltage source 210 that modifies high voltage input 242 causing phase lock loop 240 to decrease the frequency of clock signal 230. Thus, semiconductor device 220 utilizes an internal voltage source capable of providing a maximum voltage greater than that available from low voltage source 202. As just one of many advantages, such an increased voltage provides an increased tuning range without incurring the cost of external components.

Figure 3:
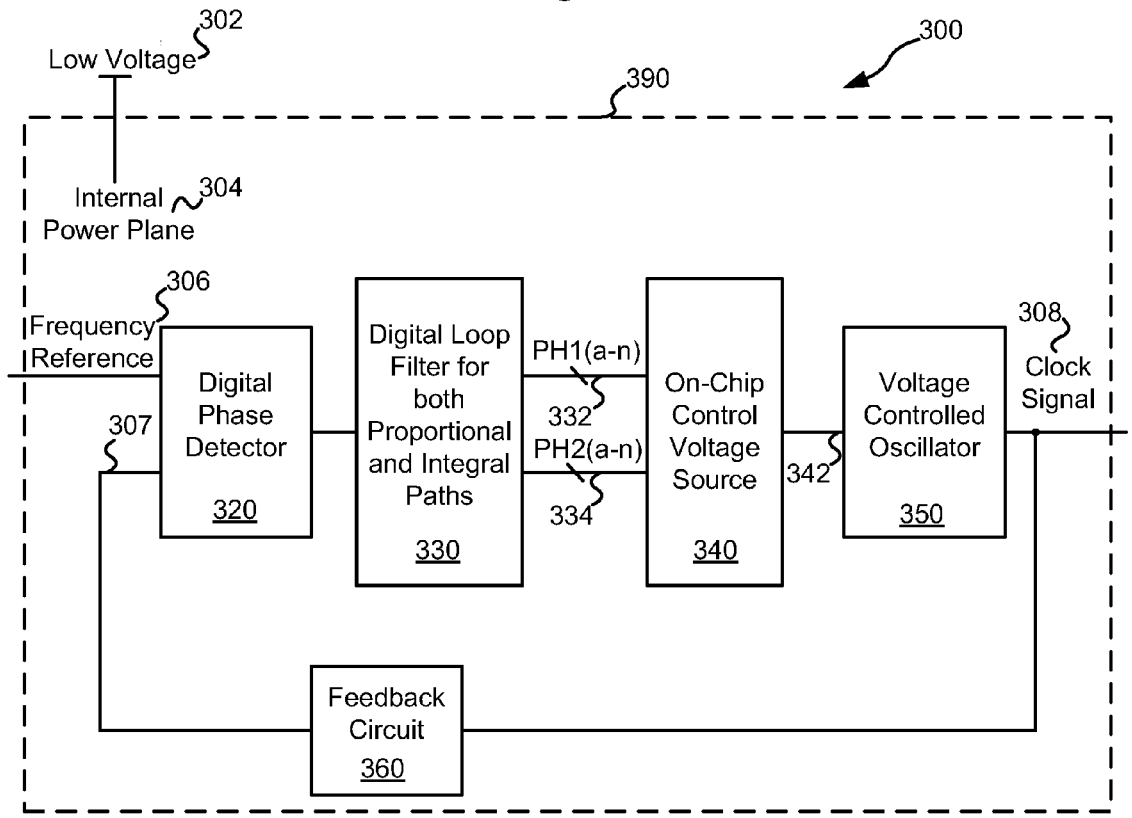
FIG. 3 depicts an implementation of a phase lock loop circuit utilizing an on-chip control voltage source in accordance with various embodiments of the present invention.

Turning to FIG. 3, an implementation of a phase lock loop circuit 300 utilizing an on-chip control voltage source 340 is depicted in accordance with various embodiments of the present invention. Phase lock loop circuit 300 is implemented on a semiconductor chip represented by a dashed line 390. The semiconductor chip is powered using a low voltage power source 302 that is electrically coupled to an internal power plane 304. Internal power plane 304 distributes the low voltage potential to an on-chip control voltage source 340, a digital phase detector 320, a digital loop filter 330, a voltage controlled oscillator 350, and a feedback circuit 360. Phase lock loop circuit 300 receives a frequency reference 306, and provides a clock signal 308 that corresponds in a predictable manner to frequency reference 306. In one particular embodiment of the present invention, clock signal 308 matches the frequency and phase of frequency reference 306. In other embodiments of the present invention, clock signal 308 matches the phase of frequency reference 306, but operates at a frequency greater than that of frequency reference 306. In yet other embodiments of the present invention, clock signal 308 operates at a frequency corresponding to frequency reference 306, but at a phase that is offset from that of frequency reference 306. Based on the disclosure provided herein, one of ordinary skill in the art will recognize a variety of phase and frequency characteristics of clock signal 308 that may be synthesized based on frequency reference 306 in accordance with different embodiments of the present invention.

On-chip control voltage source 340 may be any circuit capable of providing a voltage potential to voltage controlled oscillator that is substantially greater than the potential offered by low voltage source 302. In one particular embodiment of the present invention, on-chip control voltage source 340 provides a maximum voltage potential that is at least five times larger than low voltage source 302. In other embodiments of the present invention, on-chip control voltage source 340 provides a maximum voltage potential that is at least ten times larger than low voltage source 302. In one particular embodiment of the present invention, low voltage source 302 provides a maximum voltage of approximately three volts, and on-chip control voltage source 340 provides a maximum voltage of approximately thirty volts. Based on the disclosure provided herein, one of ordinary skill in the art will appreciate a variety of relationships between the potential provided by on-chip control voltage source 340 and that of low voltage source 302 that are capable of supporting a desired tuning range of phase lock loop circuit 300.

Digital phase detector 320 receives frequency reference 306 and compares it with a feedback signal 307 to determine a phase/frequency difference between clock signal 308 and frequency reference 306. Feedback circuit 360 may be as simple as an electrical connection that directly passes clock signal 308 through as feedback signal 307, or may be more complex such as a divider circuit that passes a divided version of clock signal 308 as feedback circuit 307. Based on the disclosure provided herein, one of ordinary skill in the art will recognize a variety of feedback circuits that may be used in relation to different embodiments of the present invention. A signal from digital phase detector 320 is provided that represents the detected phase/frequency difference. This signal is provided to a digital loop filter 330. Digital loop filter 330 filters both proportional and integral paths to provide a digital code representing any change that is to be caused in clock signal 308 by virtue of changing the voltage applied to voltage controlled oscillator 350. Voltage controlled oscillator 350 may be any circuit capable of providing an output signal with a frequency that varies based on a voltage applied thereto. Thus, as just one of many examples, voltage controlled oscillator 350 may be implemented as a varactor. In the depicted embodiment, the digital code includes a group of signal pairs (i.e., PH1($a$-$n$) 332 and PH2($a$-$n$) 334), however, it should be noted that in other embodiments of the present invention that the digital code may include other control signals.

In response to the digital code (e.g., PH1($a$-$n$) 332 and PH2 334($a$-$n$)), on-chip control voltage source 340 supplies a voltage that pushes voltage controlled oscillator 350 toward the desired frequency of clock signal 308. The direction of the push depends upon the phase difference detected by digital phase detector 320. For example, where digital phase detector 320 determines that feedback signal 307 leads frequency reference 306 (i.e., the frequency of clock signal 308 is too high), the digital code provided by digital loop filter 330 will cause the voltage applied to voltage controlled oscillator 350 to reduce the frequency of clock signal 308. In contrast, where digital phase detector 320 determines that feedback signal 307 lags frequency reference 306 (i.e., the frequency of clock signal 308 is too low), the digital code provided by digital loop filter 330 will cause the voltage applied to voltage controlled oscillator 350 to increase the frequency of clock signal 308. Thus, phase lock loop circuit 300 utilizes an internal voltage source capable of providing a maximum voltage greater than that available from internal power plane 304 to govern the frequency of an output clock signal. As just one of many advantages, such an increased voltage provides an increased tuning range without incurring the cost of external components.

It should be noted that in some embodiments of the present invention, voltage controlled oscillator 350 may be implemented off chip. In some instances of such embodiments, voltage controlled oscillator 350 may be implemented as a varactor/oscillator tank as are known in the art. In such instances, an off-chip filter may be included to achieve the desired stability and performance of phase lock loop circuit 300. In such cases where voltage controlled oscillator 350 is implemented as a varactor, the filter may be connected between a voltage output 342 from on-chip control voltage source 340 and the off-chip diode of the varactor.

Figure 4:
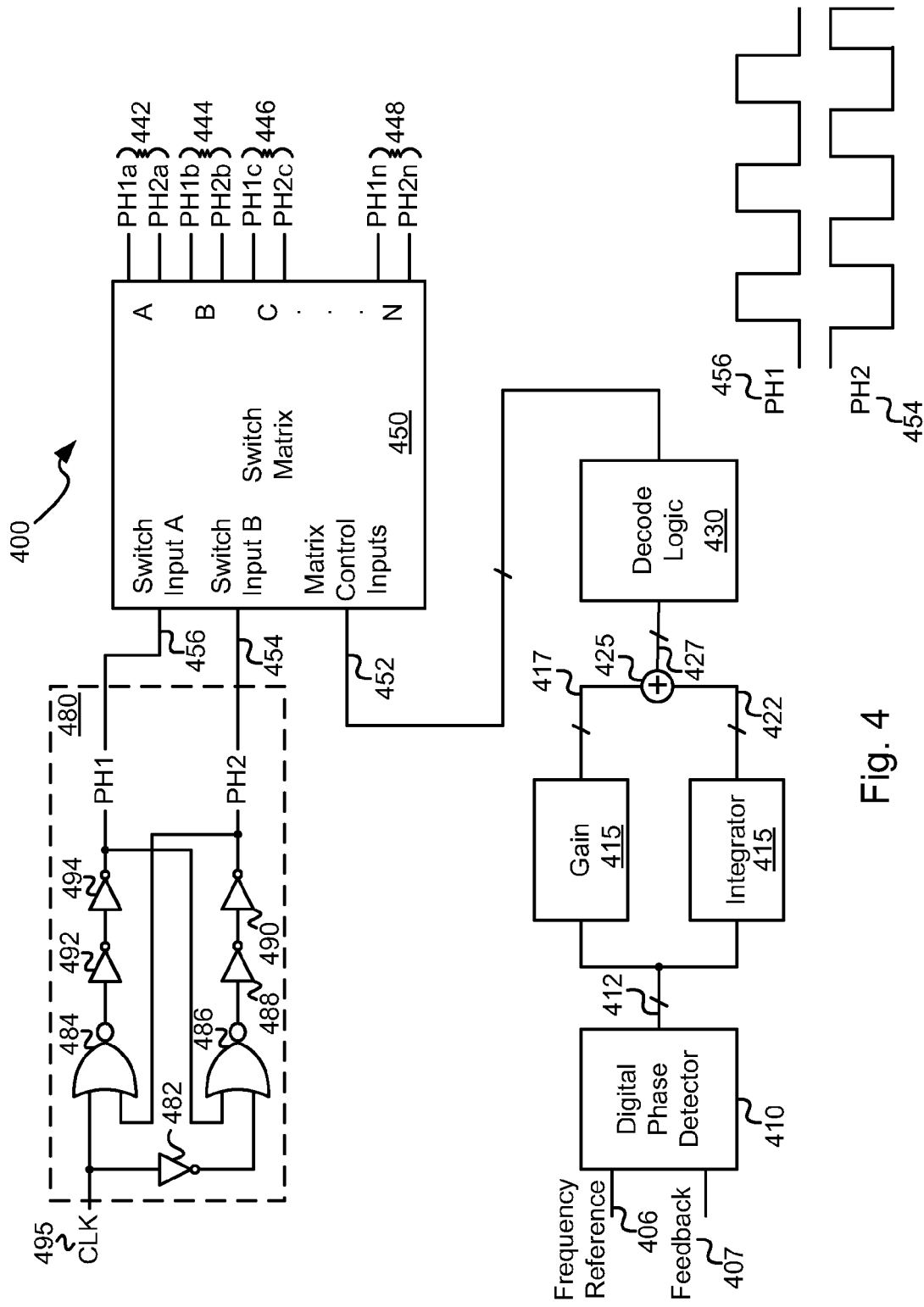
FIG. 4 shows an exemplary digital phase detector and loop filter including both proportional and integral paths in accordance with one or more embodiments of the present invention.

Turning to FIG. 4, an exemplary digital phase detector and loop filter circuit 400 in accordance with one or more embodiments of the present invention is depicted. Circuit 400 includes a clock phase generator 480 outlined with a dashed line. Clock phase generator 480 receives a clock input 495 and provides two outputs: PH1 456 and PH2 454. In one embodiment of the present invention, clock phase generator 480 includes cross coupled NOR gates 484, 486. The output of NOR gate 484 is passed through two inverters 492, 494 before driving PH1 456 and an input of NOR gate 486. The output of NOR gate 486 is passed through two inverters 488, 490 before driving PH2 454 and an input of NOR gate 484. The other input of NOR gate 484 is driven by clock input 495, and the other input of NOR gate 486 is driven by an inverted version of clock input 495 as provided by an inverter 482.

Figure 5:
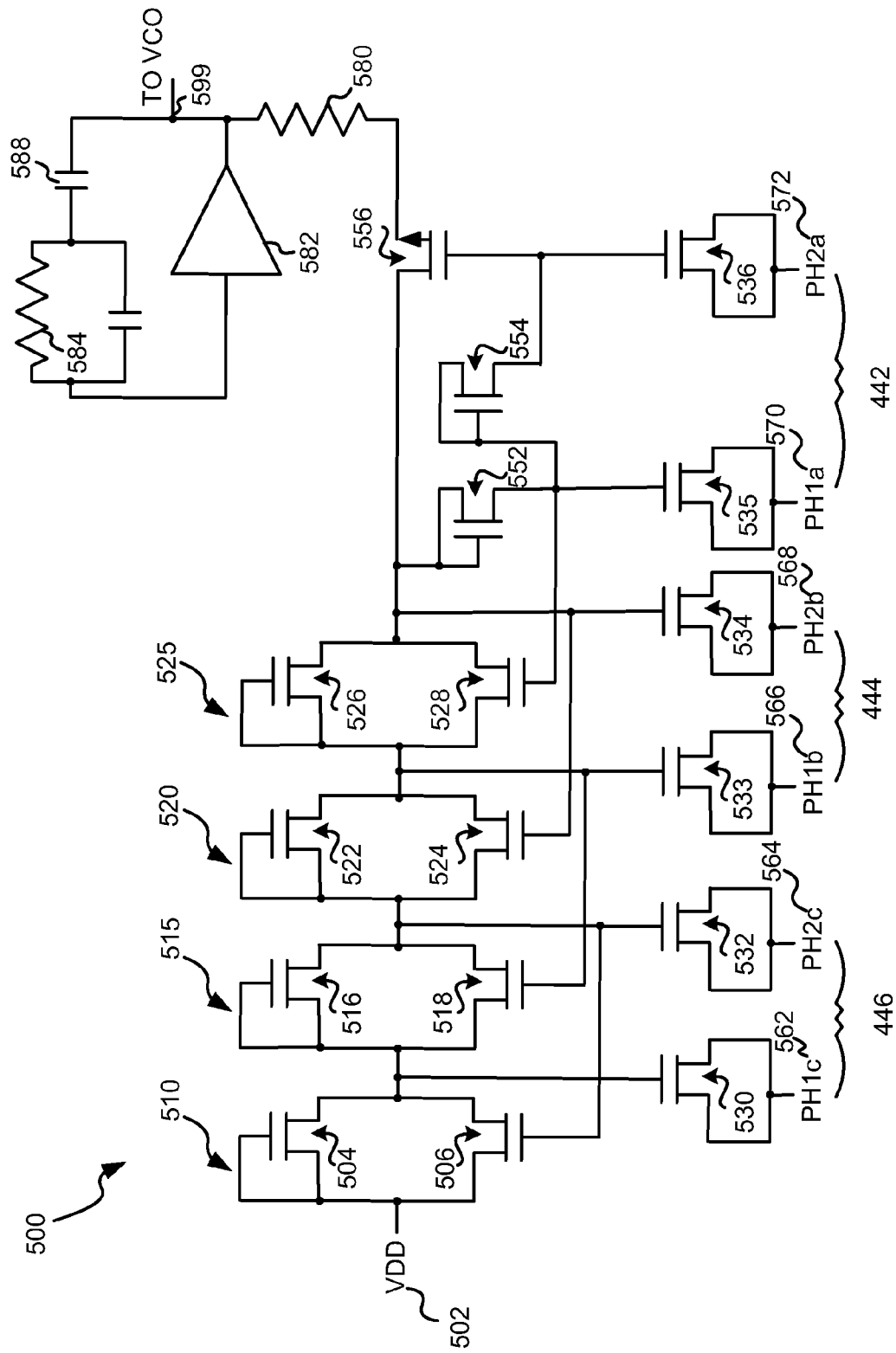
FIG. 5 depicts a particular implementation of an on-chip control voltage source that may be used in relation to one or more embodiments of the present invention.

In operation, PH1 456 and PH2 454 assert at opposite intervals based on the assertion of clock input 495. PH1 456 and PH2 454 are provided to a switch matrix 450 that operates to propagate one or more output pairs 442, 444, 446, 448 depending upon a phase difference detected by a digital phase detector 410. As more fully described below in relation to FIG. 5, the number of output pairs that are propagated corresponds to the value of voltage output 342 from on-chip control voltage source 340 that is provided to voltage controlled oscillator 350. It should be noted that the number of provided output pairs provided by switch matrix 450 affect the granularity of the value of voltage output 242 that may be selected. Thus, depending upon the desired granularity, more or fewer than the four depicted output pairs may be used in different embodiments of the present invention.

In particular, digital phase detector 410 compares the phase of frequency reference 406 (corresponding to frequency reference 306 of FIG. 3) and feedback 407 (corresponding to feedback 306 of FIG. 3) as is known in the art. Based on the comparison, digital phase detector 410 provides an output word 412 to both a gain module 415 and an integrator 420 that respectively apply a gain to output word 412 and integrate output word 412 as is known in the art. The gain and integration may be selected depending upon the particular loop feedback desired. A gain applied output word 417 from gain module 415 and an integrated output word 422 from integrator 420 are summed to create a feedback word 427. Feedback word 427 corresponds to a desired value of voltage output 342 that is determined to cause voltage controlled oscillator 350 to increase or decrease its frequency output to match frequency reference 406. In some cases, gain applied output word 417 will look like that from a first order Sigma-Delta circuit. In such cases, noise shaping techniques known in the art may be applied to mitigate any quantization effects. This may be particularly useful where a limited number of bits are available, and thus a quantization error may otherwise be significant.

Feedback word 427 is decoded using decode logic 430. Decode logic 430 provides one output (the aggregation of the outputs is labeled 452) for each output pair 442, 444, 446, 448 generated by switch matrix 450. Thus, for example, when a particular output pair 442, 444, 446, 448 is to be asserted, a corresponding output of decode logic 430 is asserted. When the output associated with the particular output pair is asserted, the particular output pair is asserted to reflect the values on PH1 456 and PH2 454. In such a case, the output pairs that are selected by output 452 pass through PH1 456 and PH2 454, while the other output pairs are placed in an inactive state. Again, increasing the number of output pairs that pass through PH1 456 and PH2 454 results in an increase in a control voltage provided to the voltage controlled oscillator. In contrast, decreasing the number of output pairs that pass through PH1 456 and PH2 454 results in an decrease in the control voltage provided to the voltage controlled oscillator Turning to FIG. 5 a particular implementation of an on-chip control voltage source circuit 500 that may be used in relation to one or more embodiments of the present invention is depicted. On-chip control voltage source circuit 500 operates to boost (or attenuate) a given input voltage (in this case VDD 502) to provide an output voltage 599. In particular, on-chip control voltage source circuit 500 includes a chain of switches that transfer cumulatively increasing charges from one capacitively boosted node to the next. Thus, for example, charge from a capacitively boosted node 510 is transferred to another capacitively boosted node 515, charge from capacitively boosted node 515 is transferred to another capacitively boosted node 520, and charge from capacitively boosted node 520 is transferred to another capacitively boosted node 525. The amount of accumulated charge is impacted by the size of devices 504, 506, 516, 518, 522, 524, 526, 528, and the number of the aforementioned devices that are activated. A series of control capacitors 530, 532, 533, 534, 535 536 control the transfer of charge from one capacitively boosted node to the other. Control capacitors are electrically coupled to respective ones of output pairs 442, 444, 446. In particular, control capacitor 530 is electrically coupled to PH1c 562 and control capacitor 532 is electrically coupled to PH2c 564, both part of output pair 446; control capacitor 533 is electrically coupled to PH1b 566 and control capacitor 534 is electrically coupled to PH2b 568, both part of output pair 444; and control capacitor 535 is electrically coupled to PH1a 570 and control capacitor 536 is electrically coupled to PH2a 572, both part of output pair 442.

As previously discussed, output pairs 442, 444, 446 can be selectively asserted such that the charge transfer from one node to another may be limited. This allows for the control of the magnitude of output voltage 599 through selection of which of capacitively boosted nodes 510, 515, 520, 525 are operated. As will be appreciated, increasing the number of capacitively boosted nodes that are operated by a corresponding output pair increases the granularity of the magnitude of control voltage 599. This increases the fineness of tuning that can be achieved via voltage controlled oscillator 350. Voltage output 599 may be filtered using a filter including one or more resistors 580, 584, operational amplifiers 582 and capacitors 586, 588 as are known in the art. Such a filter may operate to smooth any granularity caused by selection between a finite number of capacitively boosted nodes 510, 515, 520, 525.

In contrast to the prior art, the capacitively boosted nodes of on-chip control voltage source circuit 500 are controlled by digitally selectable clocks (i.e., output pairs) yielding a variable voltage output that can exceed an available voltage source and provide a reasonable on-chip voltage control to a voltage controlled oscillator. In this way, a phase lock loop requiring a relatively high power source need not include an off-chip voltage source. Of note, on-chip control voltage source circuit 500 may include a number of capacitively boosted nodes that are each of the same size (i.e., charge transfer capability), or in other cases may include a number of capacitively boosted nodes that are of different sizes. In either case, a digital control word may be provided to select the amount of charge that is transferred, and thus the value of a provided control voltage. Further, while circuit 500 is shown with four capacitively boosted nodes, it should be noted that other circuits may be designed to include a greater or lesser number of capacitively boosted nodes depending upon the acceptable level of granularity that is acceptable in the control voltage.

Additional examples of charge pumps that may be modified to be driven by a digitally selectable set of output pairs in accordance with various embodiments of the present invention are described in U.S. Pat. No. 6,191,963 entitled "Charge Pump with no Diode Drop at Output Stage", and issued Feb. 20, 2001. The entirety of the aforementioned patent is incorporated herein by reference for all purposes.

In conclusion, the invention provides novel systems, circuits, methods and arrangements for clock signal synthesizing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A semiconductor device, wherein the semiconductor device comprises:
   a power source, wherein the power source is operable to provide a supply voltage; and
   a phase lock loop circuit, wherein the phase lock loop circuit is operable to receive the supply voltage, and wherein the phase lock loop circuit includes:
      an on-chip control voltage source, wherein the on-chip control voltage source is capable of producing a control voltage that varies between a minimum voltage and a maximum voltage, and wherein the maximum voltage is more than double the supply voltage; and
      a voltage controlled oscillator, wherein the voltage controlled oscillator is operable to receive the control voltage and to provide a clock signal with a frequency corresponding to the control voltage.

2. The semiconductor device of claim 1, wherein the maximum voltage is more than six times the supply voltage.

3. The semiconductor device of claim 1, wherein the semiconductor device further comprises:
   a frequency reference; and
   a digital phase detector, wherein the digital phase detector is operable to compare the frequency reference with a derivative of the clock signal, and wherein the digital phase detector is operable to provide a digital output indicating a phase difference between the frequency reference and the derivative of the clock signal.

4. The semiconductor device of claim 3, wherein the semiconductor device further comprises:
   a digital filter, wherein the digital filter is operable to receive the digital output from the digital phase detector, and to provide a control output to the on-chip control voltage source, and wherein the control output corresponds to the phase difference between the frequency reference and the derivative of the clock signal.

5. The semiconductor device of claim 4, wherein the control output sets the control voltage between the maximum voltage and the minimum voltage.

6. The semiconductor device of claim 5, wherein the on-chip control voltage source includes a plurality of capacitively boosted nodes electrically coupled in series, and wherein the control output selects a subset of the capacitively boosted nodes.

7. The semiconductor device of claim 3, wherein the on-chip control voltage source is a charge-pump including a plurality of capacitively boosted nodes electrically coupled in series; wherein a number of the capacitively boosted nodes corresponds to the digital output enabled for operation; and wherein the number of the capacitively boosted nodes enabled for operation corresponds to the control voltage.

8. An electronic device, wherein the electronic device comprises:
   a power source, wherein the power source is operable to provide a supply voltage;
   a semiconductor device, wherein the semiconductor device includes:
      a phase lock loop circuit, wherein the phase lock loop circuit is operable to receive the supply voltage, and wherein the phase lock loop circuit includes:
         an on-chip control voltage source, wherein the on-chip control voltage source is capable of producing a control voltage that varies between a minimum voltage and a maximum voltage, and wherein the maximum voltage is greater than the supply voltage;
         a voltage controlled oscillator, wherein the voltage controlled oscillator is operable to receive the control voltage and to provide a clock signal with a frequency corresponding to the control voltage; and
         a digital filter, wherein the digital filter is operable to receive a digital output from a digital phase detector, and to provide a control output to the on-chip control voltage source, and wherein the control output corresponds to a phase difference between a frequency reference and a derivative of the clock signal.

9. The electronic device of claim 8, wherein the electronic device is selected from a group consisting of: a laptop computer, a cellular telephone, a hard disk drive, an audio player, a video player, a navigation device, and a personal digital assistant.

10. The electronic device of claim 8, wherein the digital phase detector is operable to compare the reference frequency with the derivative of the clock signal, and wherein the digital phase detector is operable to provide the digital output indicating the phase difference between the frequency reference and the derivative of the clock signal.

11. The electronic device of claim 10, wherein the derivative of the clock signal is a divided version of the clock signal.

12. The electronic device of claim 10, wherein the on-chip control voltage source includes a plurality of capacitively boosted nodes electrically coupled in series, and wherein the control output is operable to select a subset of the capacitively boosted nodes such that the control voltage is set between the maximum voltage and the minimum voltage.

13. The electronic device of claim 8, wherein the maximum voltage has a magnitude that is substantially greater than the magnitude of the supply voltage.

14. The electronic device of claim 8, wherein the maximum voltage has a magnitude that is more than six times the magnitude of the supply voltage.

15. A method for providing a clock signal, the method comprising:
   providing a supply voltage;
   providing a frequency reference;
   providing a semiconductor device, wherein the semiconductor device includes:
      a phase lock loop circuit, wherein the phase lock loop circuit receives the supply voltage and the frequency reference, and wherein the phase lock loop circuit includes:
         an on-chip control voltage source, wherein the on-chip control voltage source is capable of producing a control voltage that varies between a minimum voltage and a maximum voltage, and wherein the maximum voltage is greater than the supply voltage;
         a voltage controlled oscillator, wherein the voltage controlled oscillator receives the control voltage and provides a clock signal with a frequency corresponding to the control voltage; and
         a digital phase detector, wherein the digital phase detector compares the frequency reference with a derivative of the clock signal, and wherein the digital phase detector provides a digital output indicating a phase difference between the frequency reference and the derivative of the clock signal; and
   generating a control output corresponding to the digital output; and
   applying the control output to the on-chip control voltage source, wherein the control output sets the control voltage between the maximum voltage and the minimum voltage;
   updating the control output based on a change in the clock signal; and
   applying the updated control output to the on-chip control voltage source to effect a change in the control voltage.

16. The method of claim 15, wherein the on-chip control voltage source includes a plurality of capacitively boosted nodes electrically coupled in series, and wherein the control output selects a subset of the capacitively boosted nodes such that the control voltage is set between the maximum voltage and the minimum voltage.

17. The method of claim 15, wherein the maximum voltage has a magnitude that is substantially greater than the magnitude of the supply voltage.

* * * * *